United States Patent
Naik (10) Patent No.: US 7,618,889 B2
(45) Date of Patent: Nov. 17, 2009

(54) DUAL DAMASCENE FABRICATION WITH LOW K MATERIALS

(75) Inventor: Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

(21) Appl. No.: 11/488,529

(22) Filed: Jul. 18, 2006

(65) Prior Publication Data

US 2008/0020570 A1     Jan. 24, 2008

(51) Int. Cl.
*H01L 21/4763* (2006.01)

(52) U.S. Cl. .............................. 438/638; 257/E21.579; 438/637; 438/639

(58) Field of Classification Search ................. 438/637, 438/638, 639; 257/E21.579
See application file for complete search history.

(56) References Cited

U.S. PATENT DOCUMENTS

| | | | |
|---|---|---|---|
| 5,407,524 A | 4/1995 | Patrick et al. |
| 5,950,106 A | 9/1999 | May et al. |
| 6,127,263 A | 10/2000 | Parikh |
| 6,140,226 A | 10/2000 | Grill et al. |
| 6,147,009 A | 11/2000 | Grill et al. |
| 6,225,207 B1 | 5/2001 | Parikh |
| 6,319,821 B1 | 11/2001 | Liu et al. |
| 6,372,631 B1 | 4/2002 | Wang et al. |
| 6,380,096 B2 | 4/2002 | Hung et al. |
| 6,391,771 B1 | 5/2002 | Naik et al. |
| 6,514,671 B1 | 2/2003 | Parikh et al. |
| 6,594,540 B1 | 7/2003 | Parikh |
| 6,630,407 B2 | 10/2003 | Keil et al. |
| 6,656,840 B2 | 12/2003 | Rajagopalan et al. |
| 6,774,031 B2 | 8/2004 | Ali et al. |
| 6,842,659 B2 | 1/2005 | Parikh et al. |
| 6,940,170 B2 | 9/2005 | Parikh |
| 6,960,519 B1 * | 11/2005 | Dalton et al. ............... 438/617 |
| 7,115,517 B2 | 10/2006 | Ye et al. |
| 2002/0102856 A1 | 8/2002 | Xia et al. |
| 2002/0164870 A1 | 11/2002 | Cowley et al. |
| 2002/0187627 A1 | 12/2002 | Yuang |
| 2003/0068881 A1 | 4/2003 | Xia et al. |
| 2003/0089987 A1 | 5/2003 | Parikh |
| 2003/0216026 A1 | 11/2003 | Mukherjee-Roy et al. |

(Continued)

FOREIGN PATENT DOCUMENTS

TW         423106      *   2/2001

*Primary Examiner*—Asok K Sarkar
(74) *Attorney, Agent, or Firm*—Patterson & Sheridan, LLP (57) ABSTRACT

The invention provides methods and apparatuses for fabricating a dual damascene structure on a substrate. First, trench lithography and trench patterning are performed on the surface of a substrate to etch a low-k dielectric material layer to a desired etch depth to form a trench prior to forming of a via. The trenches can be filled with an organic fill material and a dielectric hard mask layer can be deposited. Then, via lithography and via resist pattering are performed. Thereafter, the dielectric hard mask and the organic fill material are sequentially etched to form vias on the surface of the substrate, where the trenches are protected by the organic fill material from being etched. A bottom etch stop layer on the bottom of the vias is then etched and the organic fill material is striped. As a result, the invention provides good patterned profiles of the via and trench openings of a dual damascene structure.

21 Claims, 6 Drawing Sheets

U.S. PATENT DOCUMENTS

| | | |
|---|---|---|
| 2004/0077175 A1 | 4/2004 | Hsieh et al. |
| 2004/0087166 A1 | 5/2004 | Morrow |
| 2004/0104119 A1 | 6/2004 | Edelstein et al. |
| 2004/0157460 A1 | 8/2004 | Tanaka et al. |
| 2005/0029229 A1 | 2/2005 | Chae et al. |
| 2005/0059234 A1 | 3/2005 | Bera et al. |
| 2005/0205519 A1 | 9/2005 | Kim et al. |
| 2005/0253272 A1 | 11/2005 | Ohtake et al. |
| 2005/0260856 A1 | 11/2005 | Kim et al. |
| 2005/0266691 A1 | 12/2005 | Gu et al. |
| 2005/0272265 A1 | 12/2005 | Geffken et al. |
| 2007/0224827 A1 | 9/2007 | Xiao et al. |

\* cited by examiner

DUAL DAMASCENE FABRICATION WITH LOW K MATERIALS

BACKGROUND OF THE INVENTION

1. Field of the Invention

Embodiments of the present invention generally relates to semiconductor processing technologies and, more specifically, to methods for fabricating a substrate containing dual damascene structures having low dielectric constant material thereon.

2. Description of the Related Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used in metal lines, materials with lower permittivity (low-k) dielectric constant used as insulating materials, etc. For integrated circuit fabrication, metal interconnects with low resistance, such as copper and aluminum interconnects, provide conductive paths between the integrate circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

Some integrated circuit components include multilevel interconnect structures, for example, dual damascene structures. Typically, dual damascene structures have dielectric bulk insulating layers and conductive metal layers, such as low dielectric constant materials and conductive copper layers, stacked on top of one another. Vias and/or trenches are etched into the dielectric bulk insulating layer and the conductive metal layers are subsequently filled into the vias and/or trenches and planarized, such as by a chemical mechanical planarization process (CMP), so that the conducting metal materials are only left in the vias and/or trenches. In the dual damascene approach, a rather complex dielectric stack that includes a sequence of hard mask, low-k dielectrics, and etch stop layers, etc., may be required. In addition, via lithography and patterning as well as trench lithography and patterning are required for fabricating the complex dielectric stack before filing the vias and the trenches with the conductive metal materials.

Figure 1A:
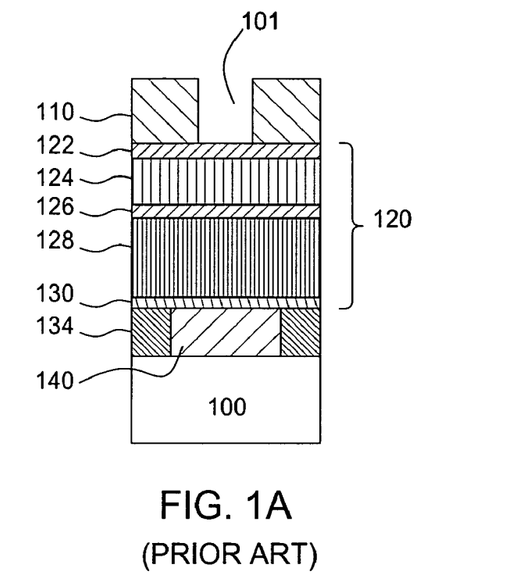
FIGS. 1A-1F are sectional views of exemplary dual damascene structures.

Different schemes to process a substrate containing dual damascene structures have been proposed. FIGS. 1A-1D illustrate an exemplary via-first scheme for processing vias and trenches in a dielectric stack 120. As shown in FIG. 1A, the dielectric stack 120 is formed over a substrate 100 having a dielectric layer 134 and a first layer of metal lines 140 formed thereon. The dielectric stack 120 includes from bottom to top a bottom barrier layer 130, a first dielectric bulk insulating layer 128, an optional middle etch stop layer 126, a second dielectric bulk insulating layer 124, and a top layer 122. The top layer 122 may be a capping layer, a hard mask layer, a dual hard mask layer, a etch stop layer, or a polish stop layer, suitable for protecting the underlying dielectric stack 120 during fabrication. The first and second dielectric bulk insulating layers 128, 124 are typically made of a low dielectric constant (e.g., κ lower than 4 material) for a copper dual damascene structure. The bottom barrier layer 130 can be silicon nitride, silicon carbide, silicon oxycarbide, or low k barrier materials. The top layer 122, and the middle etch stop layer 126 typically includes silicon oxy-nitride (SiON), tetra-ethyl-ortho-silicate (TEOS) based oxide, silicon carbide, silicon dioxide, silicon nitride, silicon oxycarbide, and the like.

Figure 1B:
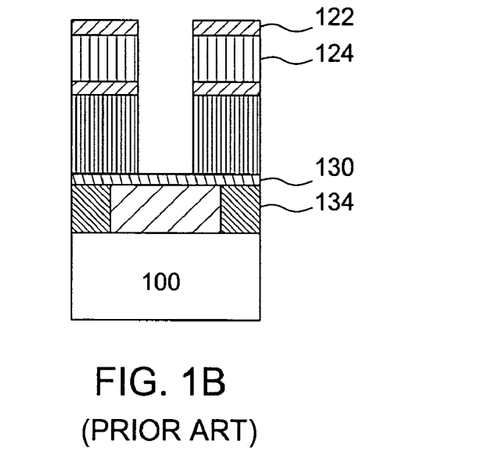
Figure 1C:
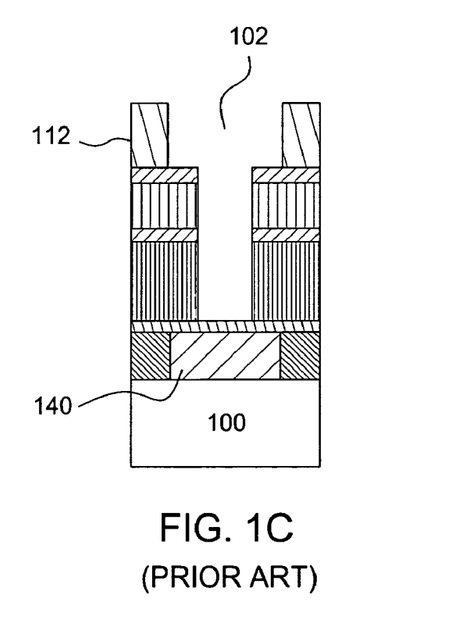

In the via first scheme as shown in FIG. 1A, a via lithography process is performed first to form a first via mask 110 on top of the dielectric stack 120 and define via openings, such as an opening 101, for etching and patterning vias. As shown in FIG. 1B, etching is performed through the dielectric stack 120 and stopped at the bottom barrier layer 130 prior to stripping the via mask 110. In FIG. 1C, a trench lithography process is then performed to form a second trench mask 112 on top of the dielectric stack 120 to define trench openings, such as an opening 102, for etching and patterning trenches. Variation of the via first scheme may additionally include a bottom anti-reflective coating (BARC) layer to fill the opening 102 and cover the dielectric stack 120 before the trench lithography process. In a scheme of BARC processing, a hard mask layer may be additionally deposited over the BARC layer to serve as an etch mask layer in order to form trenches through lithography, patterning and BARC etching.

Figure 1D:
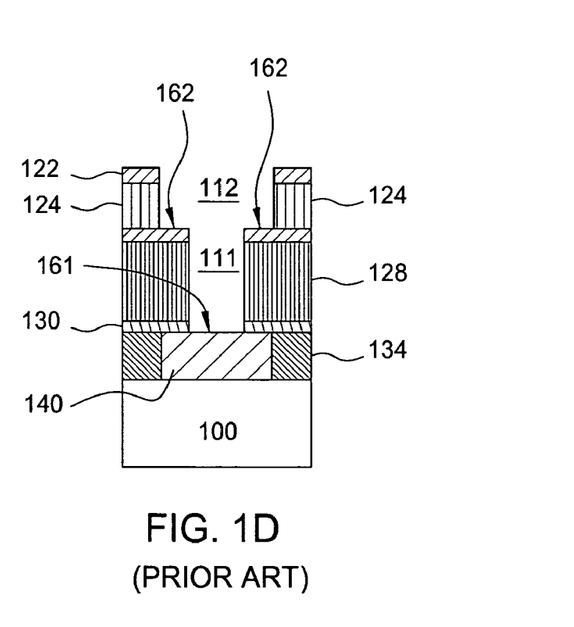

Referring back to FIG. 1D, once the trenches are formed by etching through the top layer 122 and the first dielectric bulk insulating layer 124, and stopped at the middle etch stop layer 126, if such layer is provided, or at the second dielectric bulk insulating layers 128, a via 111 and a trench 113 are finally formed and the trench mask 112 can be stripped away. As shown in FIG. 1D, the bottom barrier layer 130 is etched and opened up prior to filling the via 111 and trench 113 with a conductive metal material for forming electrical connections between the metal lines 140 and the conductive material of the via 111 and the trench 113.

Figure 1E:
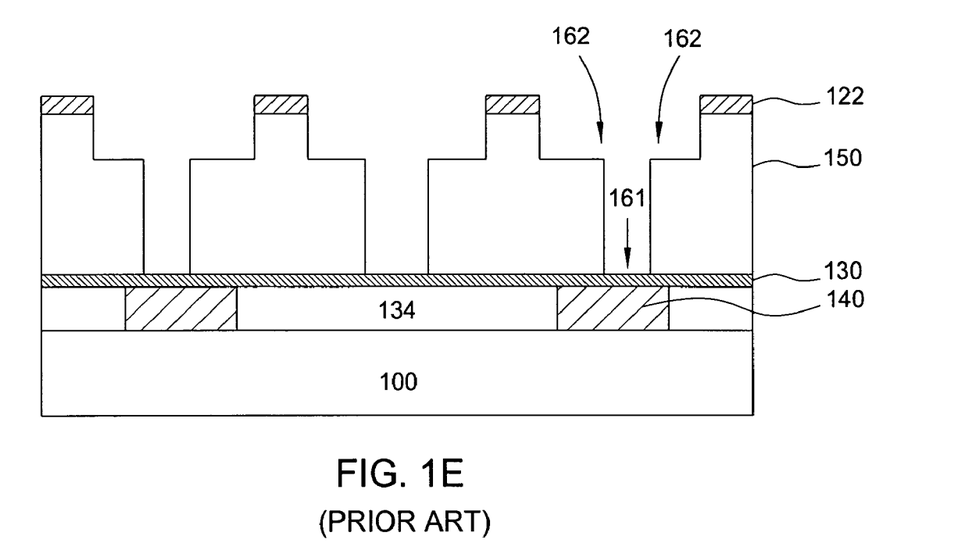
Figure 1F:
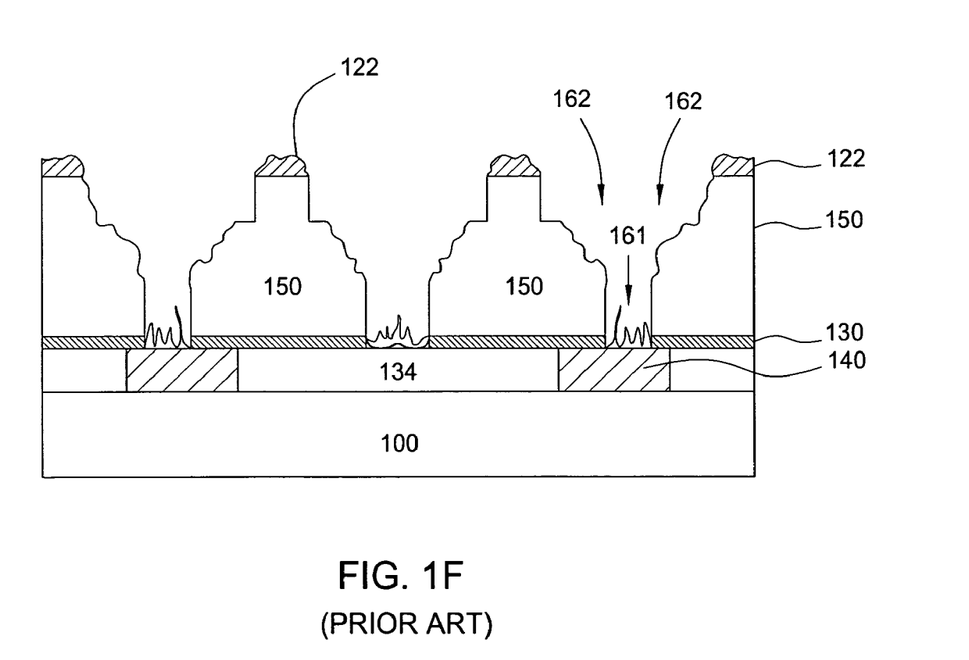

A major problem arises when opening up the bottom barrier layer 130 and good etched profiles of the material stack can not be obtained, especially when the dielectric stack 120 containing porous low k materials. FIGS. 1E and 1F illustrate the structures of etching the bottom barrier layer 130 on the substrate containing a porous low k dielectric material stack 150. Even though good smooth etching profiles are obtained in the trench area of a substrate 100 after etching of the porous low k dielectric material stack 150, as shown in FIG. 2A; however, the results of etching the bottom barrier layer 130 performed on the same substrate 100, as shown in FIG. 2B, indicate that the corners 162 and the surfaces 161 of the substrate 100 are severely damaged. Since the bottoms of the trenches are exposed during etching of the bottom barrier layer 130, the exposed surface of the corners 162 are severely eroded away. In addition, for high aspect ratios structures, the surfaces 161 of the resulting bottom of the via 111 are often very rough, contaminated with etched residues and damaged structures. As a result, reliability of the fabricated device is severely affected.

In addition, as the devices dimensions decrease, especially at below 45 nm node and beyond, via critical dimension decreases dramatically as well, such that there are other iso-dense via micro-loading issues. As a results, selective etch chemistries and resist budget greatly increase the cost of device fabrication. A dual hard mask scheme has also been used, which require an etch chamber for etching a metal hard mask material and changing to a different chamber for etching most of dielectric materials; however, via micro-loading issues still exist. Besides, all of the above dual damascene fabrication schemes have problems to control the etch depths in the vias and trenches.

Therefore, there is a need for a method of uniformly fabricating a dual damascene structure to form a desired dimension and profile of material stacks.

SUMMARY OF THE INVENTION

The present invention generally provides methods and apparatuses for forming a dual damascene structure on the surface of a substrate. In one embodiment, the method includes depositing a dielectric film stack comprising a bottom barrier layer and a bulk dielectric insulating layer on the surface of the substrate, applying a first resist material layer over the dielectric film stack, performing trench lithography on the first resist material layer to form a trench pattern thereon, and etching the dielectric film stack until an desired etching depth to define one or more trenches therein according to the trench pattern on the first resist material layer. The method further includes removing the first resist material layer from the surface of the substrate, filling the one or more trenches with an organic material, depositing a mask layer over the organic material filling the one or more trenches, applying a second resist material layer over the mask layer, and performing via lithography on the second resist material layer to form a via pattern thereon. Then, the mask layer is etched to define one or more vias within the organic material filled trenches according to the via pattern on the second resist material layer. Further, the organic material and the bulk dielectric insulating layer are etched to form the one or more vias therein according to the via pattern. Still further, the method further includes etching the bottom barrier layer to form the one or more vias therein according to the via pattern and removing the organic material from the organic material filled trenches and the one or more vias. Thus, the one or more trenches and one or more vias are formed in the dielectric film stack on the surface of the substrate.

In another embodiment, a method of forming a dual damascene structure on the surface of a substrate having a bottom barrier layer, a bulk dielectric insulating layer, and a first resist material layer deposited thereon is provided. The method includes performing trench lithography on the first resist material layer to form a trench pattern thereon, etching the bulk dielectric insulating layer until an desired etching depth to define one or more trenches therein according to the trench pattern on the first resist material layer, filling the one or more trenches with an organic material, depositing a mask layer over the organic material and a second resist material layer over the mask layer, performing via lithography on the second resist material layer to form a via pattern thereon, etching the mask layer to define one or more vias within the organic material filled trenches according to the via pattern on the second resist material layer, etching the organic material and the bulk dielectric insulating layer to form the one or more vias therein according to the via pattern, and etching the bottom barrier layer to form the one or more vias therein according to the via pattern. Then, the organic material is removed from the organic material filled trenches and the one or more vias and the one or more trenches and one or more vias are formed in the dielectric film stack on the surface of the substrate.

In still another embodiment, a method is provided to form a dual damascene structure on the surface of a substrate having a bottom barrier layer, a bulk dielectric insulating layer, and a first resist material layer deposited thereon. The method includes performing trench lithography on the first resist material layer to form a trench pattern thereon prior to performing via lithography on a second resist material layer to form a via pattern thereon, etching the bulk dielectric insulating layer until an desired etching depth to define one or more trenches therein according to the trench pattern on the first resist material layer, and filling the one or more trenches with an organic material, wherein the second resist material layer is applied over a mask layer deposited over the organic material. The method further includes etching the mask layer, the organic material, and the bulk dielectric insulating layer to define one or more vias therein according to the via pattern on the second resist material layer, etching the bottom barrier layer to form the one or more vias therein according to the via pattern, removing the organic material from the organic material filled trenches and the one or more vias, and forming the one or more trenches and one or more vias therein the dielectric film stack on the surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides methods and apparatuses for fabricating a dual damascene structure on a substrate. First, trench lithography and trench patterning are performed on the surface of a substrate to etch a low-k dielectric material layer to a desired etch depth prior to forming of a via. The trenches are then filled with an organic fill material over the low-k dielectric material and a dielectric hard mask is deposited over the organic fill material prior to performing via lithography. A via resist pattern is then used to open the dielectric hard mask, which is in turn served as an etch mask to etch the organic fill material and form vias on the surface of the substrate. In contrast to other fabrication schemes having problems with etching the trenches, when etching the vias using methods of the invention, the trenches formed by the methods of the invention are protected by the organic fill material from being etched or damaged. A bottom etch stop layer on the bottom of the vias is then etched and the organic fill material is stripped. As a result, the invention provides good patterned profiles of via openings and trench openings of a dual damascene structure and there is no damage to the patterned profile of the low-k dielectric material layer.

Figure 2:
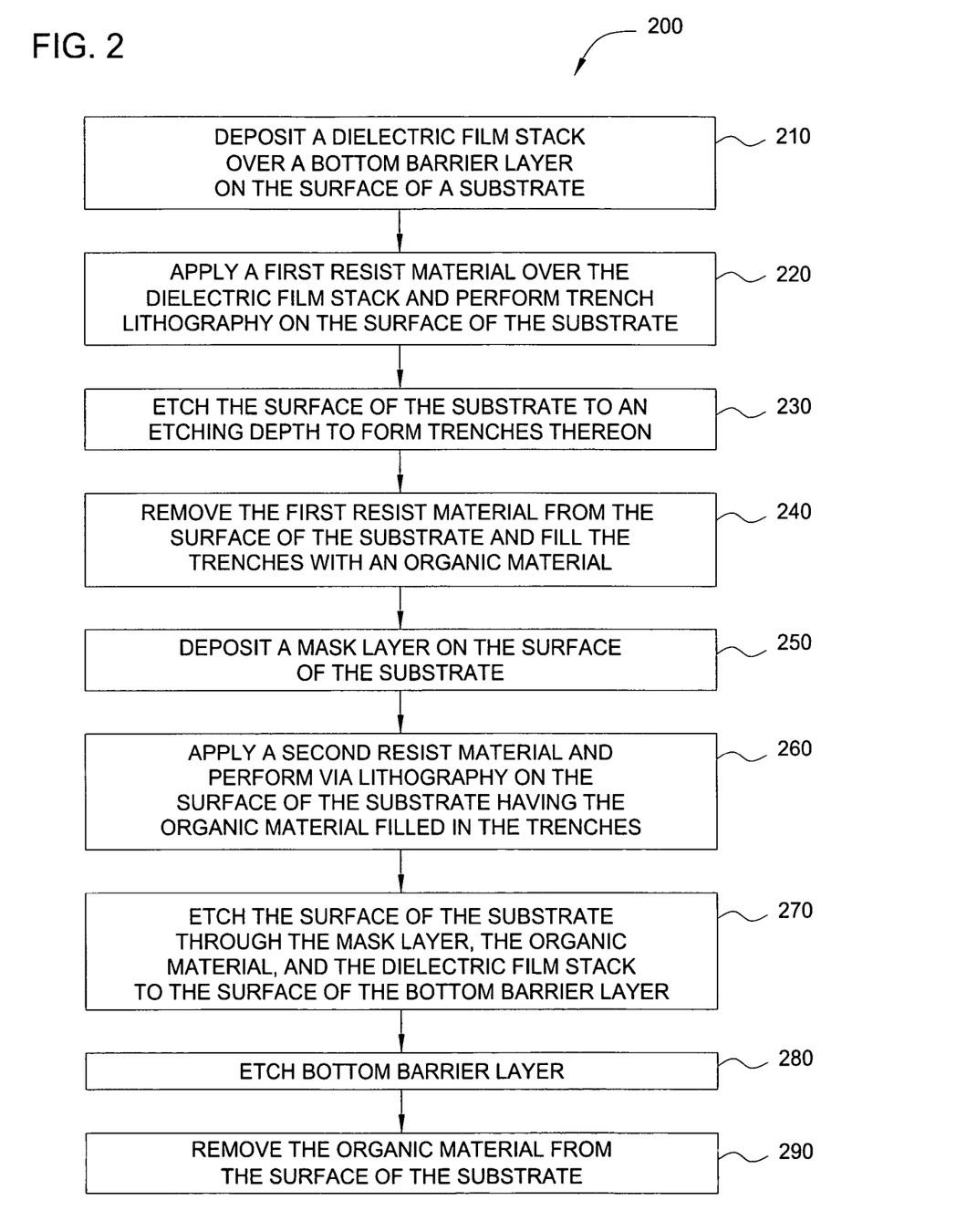
FIG. 2 is an exemplary process flow diagram of a method for fabricating and etching a dual damascene structure according to one or more embodiments of the invention.

FIG. 2 demonstrates an exemplary method 200 for fabricating and etching a dual damascene structure according to one or more embodiments of the invention. The method 200 of the invention are compatible with various film deposition and etching processes as well as various damascene fabrication schemes, such as via first fabrication schemes, BARC etch-back fabrication schemes, dual has mask fabrication schemes, tri-layer fabrication schemes, dual hard mask transfer fabrication schemes, etc.

At step 210, a dielectric film stack is deposited on the surface of a substrate, such as a bottom barrier layer thereon. The substrate may be, for example, a silicon wafer or glass substrate of any desirable sizes, and may include one or more dielectric layers having a conductive feature, such as metal lines, thereon. Chemical vapor deposition, spin-on, and other film deposition processes can be used to deposit one or more layers of the dielectric film stack of the invention. Optionally, the surface of the substrate may include the bottom barrier layer, which may comprise a dielectric material, including carbon containing silicon materials, silicon oxycarbides (SiOC), silicon carbides, silicon nitrides (SiN), carbon containing silicon nitride materials (SiCN), and combinations thereof, among others. One exemplary material for the bottom barrier/liner layer is a BLOk™ (barrier low-k) film, which is a silicon carbide film available from Applied Materials, Inc., Santa Clara, Calif. The bottom barrier layer may be treated with a plasma to improve its adhesion to the substrate.

The dielectric film stack of the invention may include a dielectric bulk insulating layer disposed over the optional dielectric bottom barrier layer. Examples of suitable materials for the dielectric bulk insulating layer include, but are not limited to, organosilicate materials, porous oxide materials, silsesquioxane materials, paralyne, carbon-doped dielectrics materials (e.g., carbon-doped organo-silicate glass (OSG), carbon-doped silicon dioxide, etc.), spin-on glass materials (e.g., un-doped silicon glass (USG), a fluorine-doped silicon glass (FSG), etc.), carbon containing silicon materials, silicon oxycarbides (SiOC), and combinations thereof. In one embodiment, the dielectric bulk insulating layer is a dielectric material having a low dielectric constant, such as less than 7.0, e.g, a dielectric constant between about 2 to about 5. Examples of an organosilicate-based low K carbon-containing silicon oxides (SiOC) dielectric material include BLACK DIAMOND® I and BLACK DIAMOND® II available from Applied Materials, Inc., of Santa Clara, Calif.

The dielectric film stack of the invention may optionally include an etch stop layer and a second dielectric bulk insulating layer deposited over the first dielectric bulk insulating layer to assist in forming and patterning trenches and vias on the surface of the substrate. Exemplary materials for the optional etch stop layer include silicon nitrides, silicon dioxides, tetra-ethyl-ortho-silicate (TEOS) based oxides, silicon carbides, silicon oxycarbide, and the like. The second dielectric bulk insulating layer may comprise dielectric materials having low dielectric constant and may include the same or different material as the dielectric bulk insulating layer described above. For example, the dielectric film stack of the invention may include a first dielectric bulk insulating layer having a dielectric constant between about 2 and about 7 (e.g., about 3) and a second dielectric bulk insulating layer having a dielectric constant between about 2 to about 5 (e.g., about 2.3).

The dielectric film stack of the invention may additionally include a top dielectric layer deposited over the dielectric bulk insulating layer. The top layer, which may comprise a dielectric material, including silicon oxynitrides (SiON), carbon containing silicon materials, silicon oxycarbides (SiOC), silicon carbides, silicon nitrides (SiN), carbon containing silicon nitride materials (SiCN), silicon oxide (SiO$_2$), tetra-ethyl-ortho-silicate (TEOS) based oxide, and combinations thereof, among others. The top layer is deposited over the surface of the substrate to protect the dielectric bulk insulating layer and may be fabricated as one or more layers, such as a single layer of dielectric capping materials or two layers of hard mask materials, depending on the applications for dual damascene structures to be fabricated and the fabrication schemes used for forming the dual damascene structures of the invention. The top layer may also include one or more layers of antireflective materials. The top dielectric layer generally comprises a material that has good etch selectivity to the dielectric bulk insulating layer.

In addition, when two layers of hard mask materials are deposited above the dielectric bulk insulating layer, two different hard mask materials that has good etch selectivity with respect to the dielectric bulk insulating layer and different CMP polishing selectivity with respect to the each other can be used. Exemplary materials to be deposited as a first hard mask layer over the dielectric bulk insulating layer may include silicon oxide (SiO$_2$), silicon oxynitrides (SiON), carbon containing silicon materials, silicon oxycarbides (SiOC), silicon carbides, silicon nitrides (SiN), carbon containing silicon nitride materials (SiCN), tetra-ethyl-ortho-silicate (TEOS) based oxide, Black Diamond™ dielectric, among others. Exemplary materials to be deposited as a second hard mask layer over the first hard mask layer may include titanium nitride, tantalum nitride, titanium, tungsten, tantalum, tungsten nitride, amorphous silicon, silicon oxide, among others.

At step 220, a first resist material is applied over the dielectric film stack and trench lithography is performed on the surface of the substrate. As a result, a patterned first resist layer for trench patterning is formed on the surface of the substrate.

At step 230, trenches are formed by etching the surface of the substrate having the dielectric film stack thereon. Using the patterned first resist layer as mask, etching is continued through the top dielectric layer and to the dielectric bulk insulating layer, and trench pattern is transferred into the low k dielectric bulk insulating layer to a required etch depth. A timed etching process can be used to etch the dielectric film stack having the dielectric bulk insulating layer to a desired pre-determined trench depth. Alternatively, compatible with fabrication schemes having an etch stop layer, etching of the dielectric film stack for forming trenches can be continued to the top of the etch stop layer and the trench etch depth is determined by the location of the etch stop layer between the first dielectric bulk insulating layer and the second dielectric bulk insulating layer. Once trenches are formed, the surface of the substrate may be cleaned and/or the dielectric film stack may be annealed.

At step 240, after the trenches are formed, the first resist material on the surface of the substrate is then removed. Alternatively, if dual hard masks or single hard mask is used, the first resist material can be designed such that the first resist material can be completely removed during the trench etch and no resist stripping is required. An organic fill material layer, such as a bottom anti-reflective coating (BARC) layer, an organic resist material layer, or an organic resin layer, is then deposited to fill the trenches. The organic material layer may be used to protect the trenches formed in the dielectric bulk insulating layer from damaging during subsequent etching processes. When BARC materials are used as the organic material layer, the BARC materials can be used to control reflections from the underlying dielectric film stack during lithography processes. The BARC layer may include, but are not limited to, an organic material, such as polyamides and polysulfones materials containing hydrogen and carbon elements, or an inorganic material, such as silicon nitrides, silicon oxynitrides, silicon carbides, among others. The BARC layer may be applied by spinning-on the substrate to fill the trenches, or, alternatively, the BARC layer may be coated, deposited, or filled in the trenches in any other suitable manner.

At step 250, a mask layer is deposited over the organic material layer on the surface of the substrate. The mask layer may be a hard mask layer to serve as an etch mask and may include a material that has good etch selectivity with respect to the organic material, such as spin on dielectric hard mask materials or CVD low temperature (such as around 250° C.) dielectric materials. The hard mask layer can also be formed of amorphous silicon. The hard mask layer may be deposited using, for example, a physical vapor deposition (PVD) process wherein a refractory metal such as titanium, tantalum, or tungsten is sputtered. Alternatively the sputtering process can occur in a nitrogen atmosphere to form a metal-nitride hard mask material. An amorphous silicon hard mask may be deposited using PVD or CVD techniques.

At step 260, a second resist material is applied over the mask layer and via lithography is performed on the surface of the substrate having the organic material layer filled in the trenches. Optionally, an organic material layer or a BARC layer can be applied over the mask layer before the second resist material. As a result, a patterned second resist layer is formed for via patterning.

At step 270, the surface of the substrate is etched through the mask layer, the organic material, and the dielectric film stack, and stopped at the bottom of the dielectric film stack, such as the bottom barrier layer. The patterned second resist layer is used as a mask to etch a pattern of vias and open the dielectric mask layer. The mask layer is used as a mask to etch the organic material layer and transfer the via pattern into the organic material layer. The via pattern in the etched organic material layer is used to as a mask to etch the dielectric bulk insulating layer all the way to the bottom barrier layer. It is contemplated that, during the via etch step, the mask budget is very high such that lean etching chemistries are used to avoid severe micro-loading issue. Also, during step 270, mis-alignment is not a concern as the mis-aligned areas can be etched away. As a result, the surface of the substrate includes a trench-filling organic material layer with via pattern.

At step 280, the bottom barrier layer is etched using the via pattern in the etched the dielectric bulk insulating layer. The surfaces of the trenches in the porous low k dielectric bulk insulating layer are protected from damage during etching of the bottom barrier layer by the trench-filling organic material layer.

At step 290, the organic material layer is removed from the surface of the substrate after the bottom barrier layer is etched. The surface of the substrate can be optionally cleaned by a wet clean processes and a dual damascene structure is formed on the surface of the substrate. In addition, the substrate having the dual damascene structure may be annealed.

The method 200 of the invention offers the advantages of good etching profiles, smooth resulting trench bottom surfaces, no damages to the low k dielectric bulk insulating layer from etching of the bottom barrier layer, and no micro-loading problems during via etch. The method 200 may be stored in memory or computer readable medium as instructions such that, when executed by a controller, the method 200 can be performed in process chambers, film deposition chambers, etch chambers, and the like.

Figure 3:
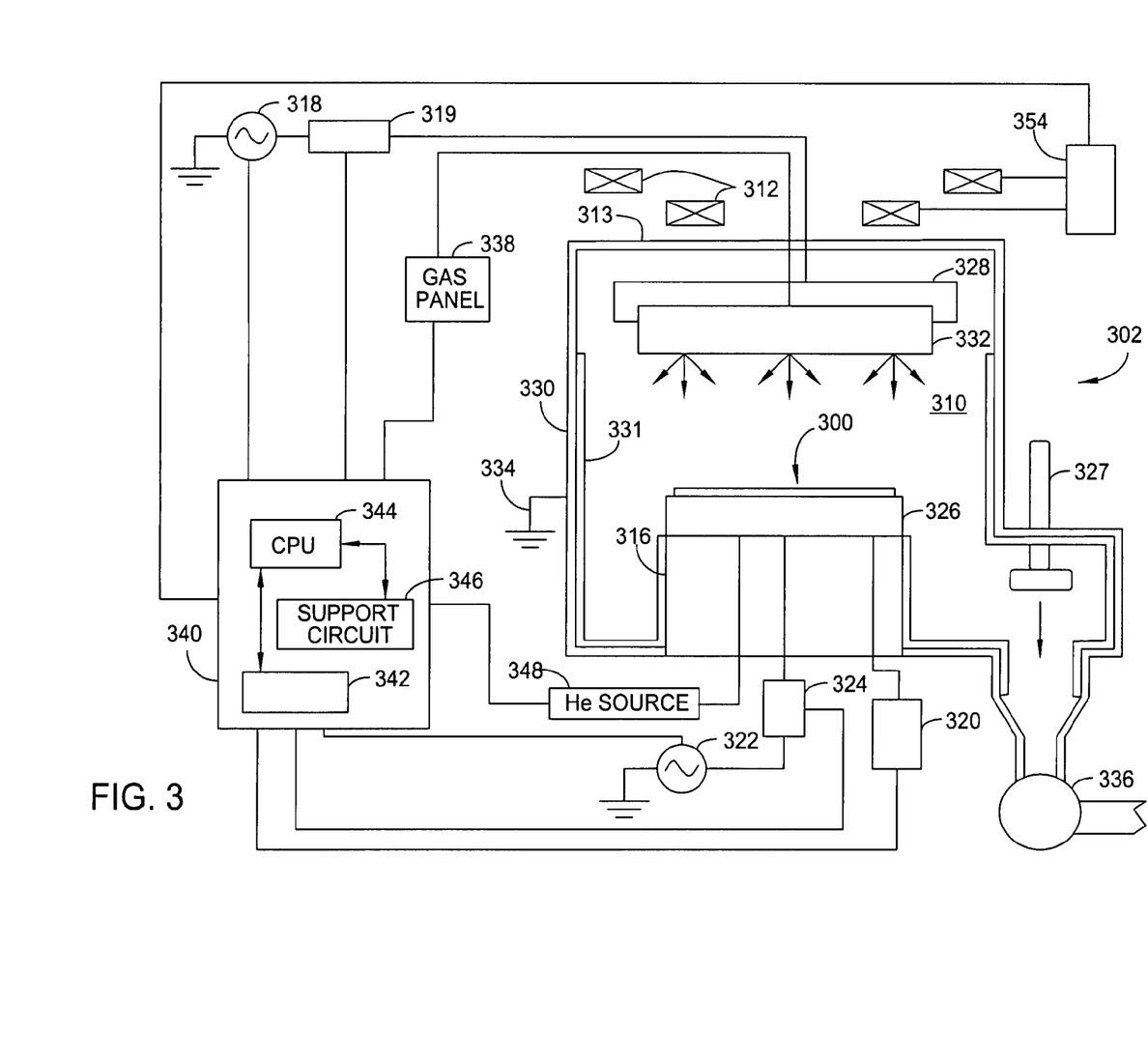
FIG. 3 is a schematic cross-sectional view of a plasma etch reactor used according to one embodiment of the invention.

FIG. 3 depicts a schematic cross-sectional view of one embodiment of a plasma etch chamber 302 suitable for performing one or more steps of the invention. One exemplary plasma etch chamber is an ENABLER® processing chamber, available from Applied Materials, Inc., of Santa Clara, Calif. It is contemplated that other etch reactors, including those from other manufactures, may be adapted to benefit from the invention. The plasma etch chamber 302 may include a process chamber 310 having a conductive chamber wall 330. The temperature of the conductive chamber wall 330 is controlled using liquid-containing conduits (not shown) that are located in and/or around the conductive chamber wall 330.

The process chamber 310 is a vacuum vessel that is coupled through a throttle valve 327 to a vacuum pump 336. The conductive chamber wall 330 is connected to an electrical ground 334. A liner 331 is disposed in the process chamber 310 to cover the interior surfaces of the conductive chamber wall 330. The liner 331 facilitates the cleaning capabilities of the process chamber 310.

The process chamber 310 also includes a support pedestal 316 and a showerhead 332. The support pedestal 316 supports a substrate 300 below the showerhead 332 in a spaced-apart relation during processing. The support pedestal 316 may include an electrostatic chuck 326 for retaining the substrate 300. Power to the electrostatic chuck 326 is controlled by a DC power supply 320. The support pedestal 316 is coupled to a radio frequency (RF) bias power source 322 through a matching network 324. The bias power source 322 is generally capable of producing an RF signal having a tunable frequency of from about 50 kHz to about 60 MHz and a bias power of about 0 to 5,000 Watts. Optionally, the bias power source 322 may be a DC or pulsed DC source.

The temperature of the substrate 300 supported on the support pedestal 316 is at least partially controlled by regulating the temperature of the support pedestal 316. In one embodiment, the support pedestal 316 includes a cooling plate (not shown) having channels formed therein for flowing a coolant. In addition, a backside gas, such as helium (He) gas from a gas source 348, is provided into channels disposed between the back side of the substrate 300 and grooves (not shown) formed in the surface of the electrostatic chuck 326. The backside helium gas provides efficient heat transfer between the support pedestal 316 and the substrate 300. The electrostatic chuck 326 may also include a resistive heater (not shown) within the chuck body to heat the electrostatic chuck 326. In one embodiment, the substrate 300 is maintained at a temperature of between about 10 to about 500 degrees Celsius.

The showerhead 332 is mounted to a lid 313 of the process chamber 310. A gas panel 338 is fluidly coupled to a plenum (not shown) defined between the showerhead 332 and the lid 313. The showerhead 332 includes a plurality of holes to allow gases, provided to the plenum from the gas panel 338, to enter the process chamber 310. The holes in the showerhead 332 may be arranged in different zones such that various gases can be released into the process chamber 310 with different volumetric flow rates. The showerhead 332 and/or an upper electrode 328 positioned proximate thereto is coupled to an RF source power 318 through an impedance transformer 319 (e.g., a quarter wavelength matching stub). The RF source power 318 is generally capable of producing an RF signal having a tunable frequency of about 160 MHz and a source power of about 0 to 5,000 Watts.

The plasma etch chamber 302 may also include one or more coil segments or magnets 312 positioned exterior to the conductive chamber wall 330, near the chamber lid 313. Power to the coil segment(s) 312 is controlled by a DC power source or a low-frequency AC power source 354. During processing, gas pressure within the interior of the process chamber 310 is controlled using the gas panel 338 and the throttle valve 327. In one embodiment, the gas pressure within the interior of the process chamber 310 is maintained at about 0.1 to 999 mTorr.

A controller 340, including a central processing unit (CPU) 344, a memory 342, and support circuits 346, is coupled to the various components of the plasma etch chamber 302 to facilitate control of the processes of the present invention. The memory 342 can be any computer-readable medium, such as random access memory (RAM), read only memory (ROM), floppy disk, hard disk, or any other form of digital storage, local or remote to the plasma etch chamber 302 or CPU 344. The support circuits 346 are coupled to the CPU 344 for supporting the CPU 344 in a conventional manner. These circuits include cache, power supplies, clock circuits, input/output circuitry and subsystems, and the like. A software routine or a series of program instructions stored in the memory 342, when executed by the CPU 344, causes the plasma etch chamber 302 to perform processes of the present invention.

FIG. 3 shows one exemplary configuration of various types of plasma reactors that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, e.g., remote plasma source, and the plasma subsequently guided into the chamber using techniques known in the art.

Other process chambers, such as Chemical Vapor Deposition (CVD) chambers, Plasma Enhanced Chemical Vapor Deposition (PECVD) chambers, Physical Vapor Deposition (PVD) chambers, etc., suitable for performing one or more steps of the invention, are also available from Applied Materials, Inc. of Santa Clara, Calif. For example, for depositing the bottom barrier layer, dielectric bulk low-k insulating layer, top dielectric layer, the dielectric film stack, and other dielectric layers of the invention, suitable silicon-based process precursors, organosilicon compounds, and other process gases can be introduced into a deposition chamber, such as PRODUCER plasma enhanced chemical vapor deposition chamber (PECVD) chamber, which is commercially available from Applied Materials, Inc. of Santa Clara, Calif.

Figure 4A:
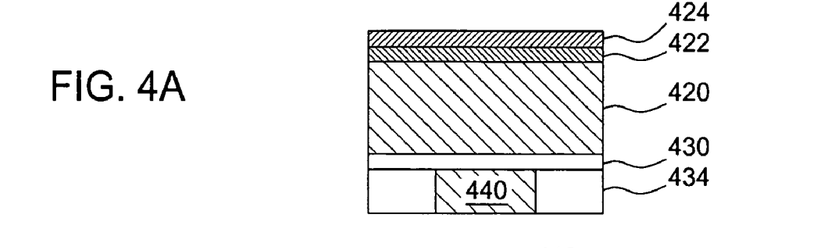
FIGS. 4A-4H are sectional views of a dual damascene structure sequentially fabricated and etched according to one or more embodiments of the invention.

FIGS. 4A-4H are sectional views during different stages of an exemplary dual damascene structure sequentially fabricated and etched on the surface of a substrate using the interconnect fabrication method 200 according to one or more embodiments of the invention. The substrate may include a dielectric base layer 434 having a organic fill material layer 440, such as copper lines, therein. An exemplary dielectric film stack including a bottom barrier layer 430, a bulk dielectric insulating layer 420, and a top layer, etc., is sequentially deposited over the dielectric base layer 434 on the surface of the substrate. For example, as shown in FIG. 4A, the exemplary top layer may include a first hard mask layer 422 and a second hard mask layer 424.

As an example, the bottom barrier layer 430 may be a low K dielectric material, such as a silicon carbide-based material, e.g., silicon oxy-carbides (SiOC), among others. The bottom barrier layer 430 may further comprise dopants, hydrogen, oxygen, nitrogen, boron or phosphorus, or combinations thereof. A low K dielectric silicon carbide-based material suitable for use as the bottom barrier layer 430 may have a dielectric constant of about 7 or less, and may be deposited by introducing a processing gas comprising an organosilicon compound into a processing chamber, such as the PRODUCER plasma enhanced chemical vapor deposition chamber (PECVD) chamber, which is commercially available from Applied Materials, Inc. of Santa Clara, Calif. The bottom barrier layer 430 may be deposited to a thickness in a range of about 200 Å to about 1000 Å, and may be formed using a process such as a plasma enhanced chemical vapor deposition process. The lower barrier layer 202 may be deposited in one embodiment of the invention by supplying an organosilicon compound, such as diphenylsilane, to a plasma processing chamber at a flow rate between about 10 milligrams/minute (mgm) and about 1500 mgm, optionally supplying a dopant at a flow rate between about 10 sccm and about 2000 sccm, providing an inert gas at a flow rate between about 1 sccm and about 10000 sccm, maintaining a substrate temperature between about 100° C. and about 500° C., maintaining a chamber pressure below about 500 Torr, and an RF power of between about 0.03 watts/cm$^2$ and about 1500 watts/cm$^2$. Detailed methods suitable for depositing the lower barrier layer 202 are further described in co-pending U.S. patent application entitled, "A Method Of Depositing Low-K Barrier Layers," publication number 2003/0068881, published Apr. 10, 2003, which is herein incorporated by reference in its entirety.

One exemplary material for the bottom barrier/liner layer is a BLOk™ (barrier low-k) film, which is a silicon carbide film available from Applied Materials, Inc., Santa Clara, Calif. Exemplary methods for forming the bottom barrier layer using chemical vapor deposition (CVD) or plasma enhanced CVD process are described in commonly owned U.S. Pat. No. 6,287,990 B1, issued Sep. 11, 2001, and U.S. Pat. No. 6,303,523 B2, issued Oct. 16, 2001, which are incorporated herein by reference. Various layers of the same or other materials, including metal lines 350 also formed on substrate 360, may lie under the BLOk™ layer, which should not affect the practice of the present invention.

In FIG. 4A, the bulk dielectric insulating layer 420 is deposited to a thickness in a range of about 1000 Å to about 4000 Å over the bottom barrier layer 430 and may be a low K dielectric material having a dielectric constant less than about 5, (e.g., less than about 4 or less than about 2.5), such as carbon-doped silicon dioxide dielectric materials, organic polymers, organosilicate, organo-silicate glass (OSG) materials, spin-on glass materials, fluorine-doped silicon glass (FSG) materials, or the like that are doped with a carbon-based dopant (e.g., alkyl functional groups). In one embodiment of the invention, the bulk dielectric insulating layer 420 comprises silicon, oxygen, and carbon, and may be deposited by providing organosilicon compounds, cyclic organosilicon compounds, aliphatic compounds, and an oxidizing gas into a deposition chamber, such as PRODUCER plasma enhanced chemical vapor deposition chamber (PECVD) chamber, commercially available from Applied Materials, Inc. of Santa Clara, Calif., under conditions sufficient to form an low dielectric constant film. The OSG is sometimes referred to as doped silicon dioxide, examples of which are Black Diamond™ I and Black Diamond™ II, both of which are available from Applied Materials of Santa Clara, Calif. Other examples of the OSG are Coral™ from Novellus of San Jose, Calif., and Sumika Film™ from Sumitomo Chemical America, Inc., Santa Clara, Calif. In the case of Black Diamond™ I, the OSG layer is grown using chemical vapor deposition by oxidizing methyl silane, as disclosed by Yau et al. in U.S. Pat. Nos. 6,054,379 and 6,072,227, which are herein incorporated by reference in its entirety. Detailed methods suitable for depositing the bulk dielectric insulating layer 420 are described in commonly assigned U.S. patent application entitled, "Crosslink Cyclo-Siloxane Compound With Linear Bridging Group To Form Ultra Low K Dielectric," Ser. No. 10/121,284, filed Apr. 11, 2002, which is herein incorporated by reference in its entirety.

Organosilane compounds of the invention may include, but not limited to, compounds having a phenyl group, such as diphenylsilane, dimethylphenylsilane, diphenylmethylsilane, phenylmethylsilane, organosilicon compounds having a formula $SiH_a(CH_3)_b(C_6H_5)_c$, wherein a is 0 to 3, b is 0 to 3, and c is 1 to 4, compounds having Si—O—Si bonding groups, such as organosiloxane compounds, compounds having Si-N-Si bonding groups, such as silazane compounds, and combinations thereof. In addition, dopant gases, such as oxygen, boron, phosphorous, an/or nitrogen can be used to reduce the dielectric constant of the deposited material. Compounds such as, for example, phosphine ($PH_3$) or borane ($BH_3$), or diborane ($B_2H_6$) may be introduced into the processing chamber during the deposition process in order to facilitate doping the film with boron or phosphorus. Oxygen-containing dopant gases include, for example, oxygen ($O_2$), ozone ($O_3$), nitrous oxide ($N_2O$), carbon monoxide (CO), carbon dioxide ($CO_2$), or combinations thereof.

As shown in FIG. 4A, one or more top layers or capping layers are deposited over the bulk dielectric insulating layer 420. For example, the first hard mask layer 422 or a first cap layer may have a thickness of about 200 angstroms to about 1000 angstroms and may be a dielectric hard mask material, such as $SiO_2$, SiON, SiC, oxygen-doped silicon carbide (SiOC), silicon nitride (SiN), SiOCN, nitrogen-doped silicon carbide (SiCN), or the like that may be etched at a rate that is different from that of the bulk dielectric insulating layer 420 and other dielectric layers, when exposed to an etchant. In the embodiment depicted in FIG. 4A, the hard mask layer 422 is a SiOC layer spin on-applied on the bulk dielectric insulating layer 420 to serve as an etch mask during trench etching. Alternative, the hard mask layer 422 may be deposited over the bulk dielectric insulating layer 420 by a chemical vapor deposition (CVD) technique.

The second hard mask layer 424 or a second cap layer is deposited over the first hard mask layer 422 to a thickness in a range of about 300 angstroms to about 1500 angstroms. The second hard mask layer 424 generally comprises a material, such as a conductive material, a metal material, or metal nitride, that has good etch selectivity with respect to the first hard mask layer 422 and with respect to the bulk dielectric insulating layer 420. The second hard mask layer 424 may comprise a refractory metal nitride, such as a material selected from the group consisting of titanium nitride, tantalum nitride, and tungsten nitride or a refractory metal such as tungsten or titanium. The hard mask layer 212 could also be formed of dielectric materials, such as amorphous silicon, among others. The second hard mask layer 424 may be deposited using, for example, a physical vapor deposition (PVD) process wherein a refractory metal such as titanium, tantalum, or tungsten is sputtered. Alternatively the sputtering process can occur in a nitrogen atmosphere to form a metal-nitride hard mask material. An amorphous silicon hard mask may be deposited using PVD or CVD techniques.

Figure 4B:
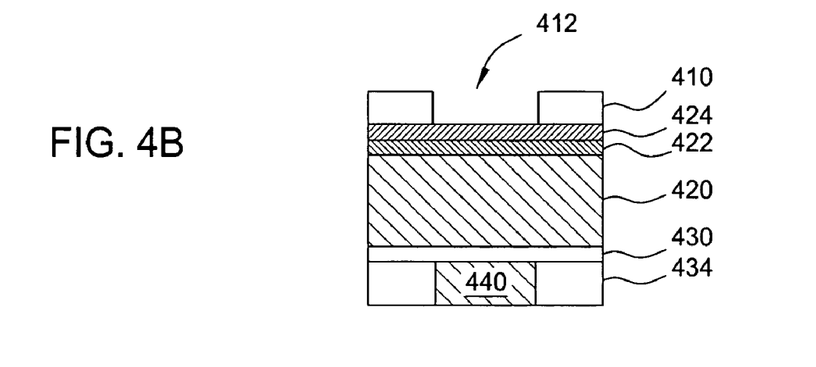

Referring to FIG. 4B, a photoresist layer 410 is deposited to a thickness of about 500 angstroms to about 2000 angstroms and trench lithography is used to define a trench pattern 412 on the photoresist layer 410. The photoresist layer 410 may comprise a conventional carbon-based, organic or polymeric materials used for integrated circuit lithography. Additional layer on top of the photoresist layer 410 for trench lithography can be used. Thus, a number of patterning schemes can be used for trench patterning and an addition layer of organic fill material or BARC material or a tri-layer of BARC, hard mask, and photoresist materials can also be used to define the trench pattern 412. For example, a single resist layer can be spin-coated on dielectric materials. Alternatively, a tri-layer including an organic fill material, an optional hard mask layer, and a resist layer can be used for trench patterning. In addition, a thin layer of organic fill material plus a resist layer can also be used. Further, a thick layer of organic fill material plus a hard mask layer and a resist layer can also be used.

Figure 4C:
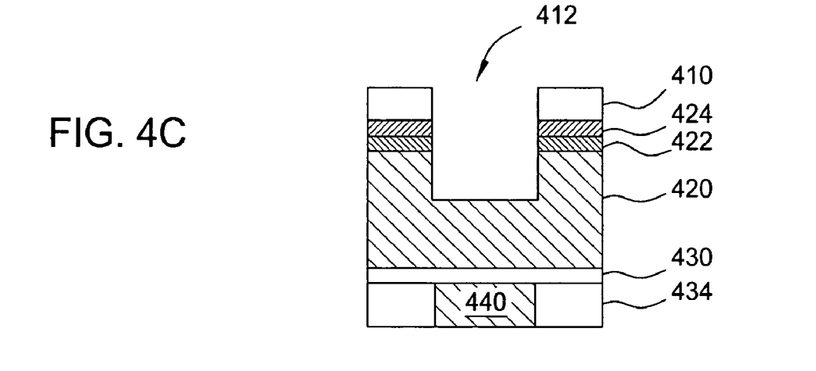

As shown in FIG. 4C, once the photoresist layer 410 is patterned, etching of the second hard mask layer 424, the first hard mask layer 422, and the bulk dielectric insulating layer 420 is performed and the trench pattern 412 is transferred into the bulk dielectric insulating layer 420. To reduce the number of process chambers involved in the formation of the dual damascene structure, a dielectric etch chamber can be used to etch both the second hard mask layer 424 (a metal, metal-nitride, or amorphous silicon material) and the first hard mask layer 422 (low K dielectric material). To etch a metal or metal-nitride hard mask, an etchant for metal is used. For example, if the hard mask is made of TiN, then a chlorine-based chemistry can be used. Alternatively, if the hard mask is tungsten, then a $SF_6$-based chemistry is used. For an amorphous silicon hard mask, the chemistry is generally fluorine-based. For example, one or more fluorocarbon gases, such as $CF_4$, $C_2F_6$, $C_2F_8$, $C_3F_8$, $C_4F_{10}$, $C_4F_8$, $CHF_3$, or combinations thereof, among others can be used for etching hard mask materials. Generally, during etch of the hard mask materials, a low bias power is used to enhance the selectivity. Process parameters for etching these hard mask materials are well known in the art.

Etching the bulk dielectric insulating layer 420 may include one or more etchant gases having fluorocarbon gases with relatively high fluorine to carbon ratios, such as $CF_4$, $C_2F_8$, $CHF_3$, or combinations thereof, among others. Additional inert gases, such as $N_2$, $NH_3$, $NF_3$, etc., can also be added into a mixture of process etching gases for the bulk dielectric insulating layer 420. As one example, the bulk dielectric insulating layer 420 may be etched by supplying at least about 500 sccm of argon, between about 4 and about 400 sccm of $CF_4$, between about 0 and about 200 sccm of $CH_2F_2$, between about 0 to about 400 sccm of nitrogen gas ($N_2$), applying between about 100 Watts and about 300 Watts of a source power to the upper electrode, applying between about 1500 Watts and 3000 Watts of a bias power to the substrate pedestal, and maintaining the etch chamber at substrate temperature of between about −20° C and about 30° C. and a chamber pressure of between about 10 mTorr and about 250 mTorr. One exemplary process recipe provides supplying a mixture of 2000 sccm of Ar, 20 sccm of $CH_2F_2$, 40 sccm of $CF_4$, 40 sccm of $N_2$, applying 200 Watts source power to the upper electrode and 2000 Watts to the substrate pedestal, maintaining a substrate temperature of about 20° C., and maintaining a pressure in the etch chamber of about 100 mTorr.

Etching of the trench pattern 412 to the surface of the substrate is performed until either after a predetermined time period or by a conventional optical endpoint measurement technique that determines an etching end point. The predetermined time period using specific etching chemistry can be correlated to a desired etch depth within the underlying bulk dielectric insulating layer 420. Endpoint detection can be performed by monitoring emissions from the plasma, whether portions of the underlying bulk dielectric insulating layer 420 in the opening of the trench pattern 412 have become exposed to the plasma. Alternatively, a trench-etch stop layer can be deposited prior within the underlying bulk dielectric insulating layer 420 and trench etch can be stopped on the surface of the trench-etch stop layer.

The photoresist layer 410 is then removed, for example, by contacting with a plasma, such as flowing an gas mixture and/or an inert gas (e.g., nitrogen, argon, etc.) into a substrate process chamber. The gas mixture may be an oxidizing or a reducing chemistry, including, but not limiting to, oxygen, ammonium $NH_3$, carbon dioxide, hydrogen gas, water, and combinations thereof, among others. Alternatively, a wet process can be used to strip away the photoresist layer 410 in a substrate process chamber, if there is no organic material underneath the photoresist layer 410. Examples of substrate process chambers include Enabler chambers, eMax chambers, AXIOM chambers, all of which are commercially available from Applied Materials Inc, of Santa Clara, Calif. A source power of about 2 kW may be applied to an antenna to ignite the gas mixture into a plasma. The chamber may be maintained at a pressure of about 5 to 150 mTorr and at a temperature between about 20° C. to about 400° C. Alternatively, removal of the photoresist can be performed in an etch chamber.

Optionally, the surface of the substrate can be cleaned and the film stack may be annealed, once the photoresist layer 410 is removed and the trench pattern 412 is formed. For example, the substrate can be cleaned with a surface-cleaning solution inside a wet clean chamber and annealed in an annealing chamber. Examples of wet clean chambers and annealing chambers are available from Applied Materials, Inc. of Santa Clara, Calif.

Figure 4D:
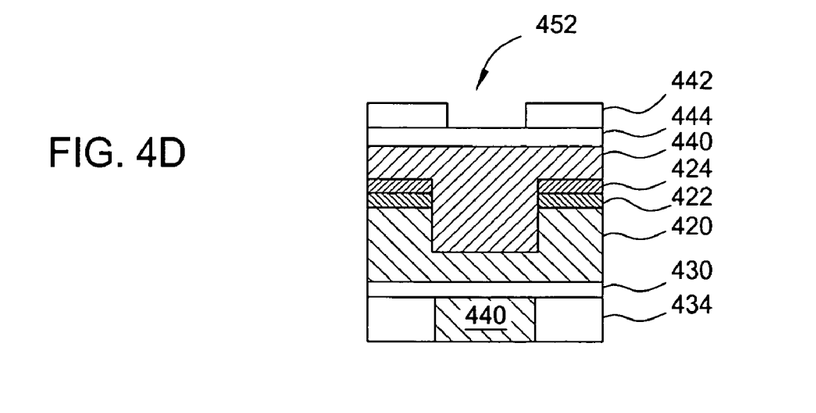

As shown in FIG. 4D, a tri-layer including an organic fill material layer 440, a mask layer 444, and a photoresist layer 442 is sequentially deposited over the surface of the substrate for filling the trench pattern 412 and subsequent via patterning. The organic fill material layer 440 can include a BARC material, an organic resist material, or an organic resin material. The organic fill material layer 440 fills the trench pattern 412, covers the dielectric film stacks and generally comprises organic materials, such as polyamides and polysulfones, resist materials organic resins, and the like. The mask layer 444 can be deposited by a low temperature CVD or a spin-on technique. Optionally, there can be a thin layer of BARC material between the mask layer 444 and the photoresist layer 442. As shown in FIG. 4D, the organic fill material layer 440 is deposited to fill the trench pattern 412 before via lithography. The mask layer 444 and the photoresist layer 442 deposited over the organic fill material layer 440 can be any of the hard mask and photoresist materials as described above. The photoresist layer 442 is patterned with a via pattern 452 using photolithography techniques.

Figure 4E:
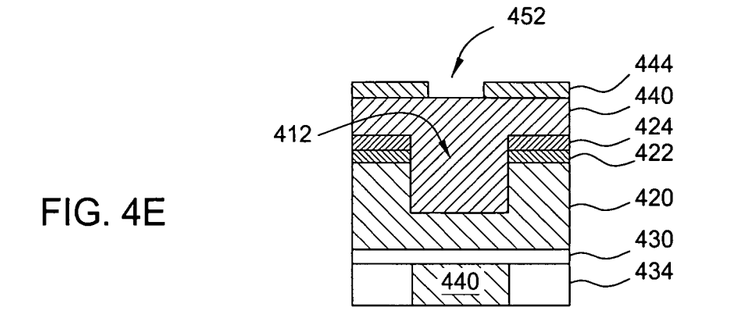

As shown in FIG. 4E, the photoresist layer 442 with the via pattern 452 is used as a mask to etch open the mask layer 444. At this stage of opening up the mask layer 444, the photoresist layer 442 may be removed or remain on the surface.

Figure 4F:
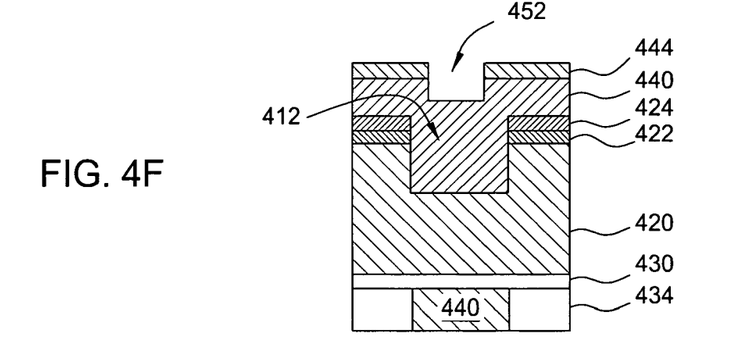

In FIG. 4F, etching of the organic fill material layer 440 is performed and the mask layer 444 is used to transfer the via pattern 452 to the organic fill material layer 440. For example, the organic fill material layer 440 can be etched by forming a plasma from a gas mixture having a nitrogen-containing gas, such as $NH_3$ gas, a hydrogen-containing gas, and an oxygen-containing gas, such as CO and/or $O_2$, or a combinations thereof, in an etch chamber, such as the plasma etch chamber 302 as described in FIG. 3, or in other suitable reactors. One example of a gas mixture for etching the organic fill material layer 440 includes $NH_3$, CO and $O_2$. Another example for etching the organic fill material layer 440 includes a mixture of hydrogen gas ($H_2$) and nitrogen gas ($N_2$). In addition, one or more fluorocarbon gases, such as $CF_4$, $C_2F_6$, $C_2F_8$, $C_3F_8$, $C_4F_{10}$, $C_4F_8$, $CHF_3$, or combinations thereof, can also be included in the gas mixture to etch the bulk dielectric insulating layer organic fill material layer 440. The etching gas mixture may further include an inert gas, such as helium, argon, neon, xenon, and krypton, of which argon is most often used.

Figure 4G:
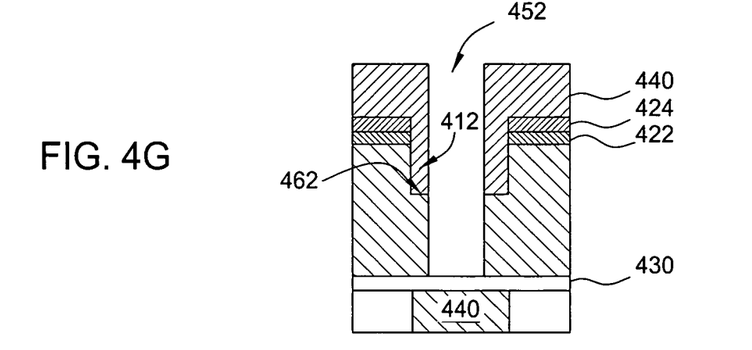

As shown in FIG. 4G, etching is continued through the organic fill material layer 440 to the bottom of the bulk dielectric insulating layer 420 and stopped on the bottom barrier layer 430. Accordingly, the via pattern 452 is transferred into the bulk dielectric insulating layer 420 using the mask layer 444. The organic fill material layer 440 and the bulk dielectric insulating layer 420 can be simultaneously etched by supplying additional etchant gases into the etch chamber after the gas mixture for etching the organic fill material layer 440 is supplied therein or, alternatively, they can be etched sequentially with different etch chemistries. As an example, a mixture of at least about 500 sccm of argon, between about 4 and about 400 sccm of $CF_4$, between about 0 and about 200 sccm of $CH_2F_2$, between about 0 to about 400 sccm of N2 can be used to etch the bulk dielectric insulating layer 420. However, other suitable etch chemistries can also be used. During transferring the via pattern 552 into the bulk dielectric insulating layer 420 and etching of the organic fill material layer 440 and the bulk dielectric insulating layer 420, the mask layer 444 may be conveniently etched away, leaving the organic fill material layer 440 with deep via etch depth and the via pattern 452 aligned with the pattern of the organic fill material layer 440. Advantageously, the trench pattern 412 for fabricating trenches within the bulk dielectric insulating layer 420 is protected by the organic fill material layer 440 and one or more trench bottom surfaces 462 are kept undamaged during via patterning.

Figure 4H:
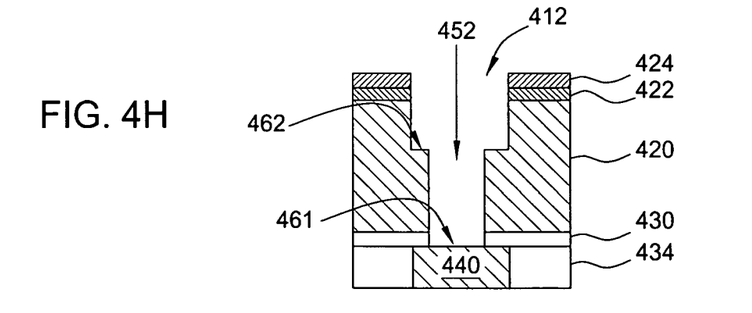

In FIG. 4H, the bottom barrier layer 430 is etched open to the top surface of the organic fill material layer 440. When the bottom barrier layer is a Blok film, an etching gas mixture, tetraflurocarbon ($CF_4$), oxygen ($O_2$), nitrogen ($N_2$), and agron (Ar) can be used. In addition, $CH_2F_2$ or $CH_3F$ can also be used. In contrast to prior art processes, there is not residue left on one or more via bottom surfaces 461 of the via pattern 452 after Blok open. Once the bottom barrier layer 430 is etched open and the via pattern 452 is transferred, the remaining portion of the organic fill material layer 440 can be stripped away easily, leaving trench bottom surfaces 462 and via bottom surfaces 461 very clean and undamaged.

Once the organic fill material layer 440 is removed and cleaned, one or more trenches and one or more vias are formed in the dielectric film stack on the surface of the substrate. For example, the surface of the substrate can be cleaned by a wet clean chamber, e.g., an Oasis chamber, a Mariner chamber, available from Applied Material, Inc., Santa Clara, Calif. In addition, the substrate having the dielectric film stack can be annealed in an annealing chamber after via patterning or between trench patterning and via patterning. Subsequently, the one or more trenches and one or more vias formed by the methods of the invention can be filled with a conductive metal, such as copper or aluminum, to be interconnected with the organic fill material layer 440 and form a metal interconnect.

Etching techniques that may be used to fabricate the dual damascene structures of the present invention may be practiced, for example, in a processing system such as a CENTURA® semiconductor wafer processing system commercially available from Applied Materials, Inc. of Santa Clara, Calif. The CENTURA® semiconductor wafer processing system may be equipped with the plasma etch chamber 302 as described in FIG. 3 or with any other dual frequency capacitive plasma source reactors, which are adapted for processing substrates of various sizes and operated in broad ranges of the process parameters and etchant chemistries. The semiconductor wafer processing system may also be equipped with an endpoint detection system and/or in-situ self-cleaning capabilities. A detailed description of a suitable dual frequency capacitive plasma source reactor is provided in U.S. Patent Application Publication Number 2003/0218427, published Nov. 27, 2003 which is commonly assigned to Applied Materials, Inc., and is herein incorporated by reference in its entirety.

While the foregoing is directed to embodiments of the present invention, other and further embodiments of the invention may be devised without departing from the basic scope thereof, and the scope thereof is determined by the claims that follow.

The invention claimed is:

1. A method of forming a dual damascene structure on the surface of a substrate, comprising:
    depositing a dielectric film stack comprising a bottom barrier layer and a bulk dielectric insulating layer on the surface of the substrate;
    applying a first resist material layer over the dielectric film stack;
    performing trench lithography on the first resist material layer to form a trench pattern thereon;
    etching a portion of the dielectric film stack to define one or more trenches therein according to the trench pattern on the first resist material layer;
    removing the first resist material layer from the surface of the substrate;
    filling the one or more trenches with an organic material;
    depositing a mask layer over the organic material filling the one or more trenches;
    applying a second resist material layer over the mask layer;
    performing via lithography on the second resist material layer to form a via pattern thereon;
    etching the mask layer to define one or more vias within the organic material filled trenches according to the via pattern on the second resist material layer;
    etching the organic material to form the one or more vias therein according to the via pattern;
    etching the bulk dielectric insulating layer to form the one or more vias therein according to the via pattern;
    etching the bottom barrier layer to form the one or more vias therein according to the via pattern;
    removing the organic material from the organic material filled trenches and the one or more vias; and
    forming the one or more trenches and one or more vias therein the dielectric film stack on the surface of the substrate.

2. The method of claim 1, wherein the bulk dielectric insulating layer comprises a low K dielectric material selected from the group consisting of organosilicate materials, porous oxide materials, silsesquioxane materials, polymer materials, benzocyclobutene, polytetrafluoroethylene, parylene, polyether, polyimide, polyamide materials, carbon-doped dielectrics materials, carbon-doped organo-silicate glass (OSG) materials, carbon-doped silicon dioxides, spin-on glass materials, un-doped silicon glass (USG) materials, fluorine-doped silicon glass (FSG) materials, carbon containing silicon materials, silicon oxycarbides (SiOC), and combinations thereof.

3. The method of claim 1, wherein the bottom barrier layer comprises a low K dielectric material selected from the group consisting of carbon containing silicon materials, silicon oxycarbides (SiOC), silicon carbides, silicon nitrides (SiN), carbon containing silicon nitride materials (SiCN), and combinations thereof.

4. The method of claim 1, wherein the dielectric film stack further comprises one or more top dielectric material layer.

5. The method of claim 4, wherein the one or more top dielectric material layers comprises a hard mask material selected from the group consisting of silicon oxynitrides (SiON), carbon containing silicon materials, silicon oxycarbides (SiOC), silicon carbides, silicon nitrides (SiN), carbon containing silicon nitride materials (SiCN), silicon oxide (SiO$_2$), tetra-ethyl-ortho-silicate (TEOS) based oxide, and combinations thereof.

6. The method of claim 1, wherein the dielectric film stack further comprises a hard mask material layer having a material selected from the group consisting of tantalum, titanium, tungsten, tantalum nitride, titanium nitride, tungsten nitride, amorphous silicon, and combinations thereof, deposited over the dielectric film stack.

7. The method of claim 1, wherein the bulk dielectric insulating layer comprises a first dielectric material layer, a second dielectric material layer, and an etch stop layer between the first and the second dielectric material layers.

8. The method of claim 1, wherein the substrate is annealed after the dielectric film stack is etched to the desired etching depth.

9. The method of claim 1, further comprising cleaning of the surface of the substrate.

10. The method of claim 1, further comprising depositing an additional organic fill material layer between the mask layer and the second resist material layer.

11. The method of claim 1, further comprising annealing the surface of the substrate after the one or more trenches and one or more vias are formed.

12. A method of forming a dual damascene structure on the surface of a substrate having a bottom barrier layer, a bulk dielectric insulating layer, and a first resist material layer deposited thereon, comprising:
    performing trench lithography on the first resist material layer to form a trench pattern thereon;
    etching a portion of the bulk dielectric insulating layer to define one or more trenches therein according to the trench pattern on the first resist material layer;
    filling the one or more trenches with an organic material;
    depositing a mask layer over the organic material and a second resist material layer over the mask layer;
    performing via lithography on the second resist material layer to form a via pattern thereon;
    etching the mask layer to define one or more vias within the organic material filled trenches according to the via pattern on the second resist material layer;
    etching the organic material and the bulk dielectric insulating layer to form the one or more vias therein according to the via pattern;
    etching the bottom barrier layer to form the one or more vias therein according to the via pattern;
    removing the organic material from the organic material filled trenches and the one or more vias; and
    forming the one or more trenches and one or more vias therein the dielectric film stack on the surface of the substrate.

13. The method of claim 12, wherein the bulk dielectric insulating layer comprises a low K dielectric material selected from the group consisting of organosilicate materials, porous oxide materials, silsesquioxane materials, polymer materials, benzocyclobutene, polytetrafluoroethylene, parylene, polyether, polyimide, polyamide materials, carbon-doped dielectrics materials, carbon-doped organo-silicate glass (OSG) materials, carbon-doped silicon dioxides, spin-on glass materials, un-doped silicon glass (USG) materials, fluorine-doped silicon glass (FSG) materials, carbon containing silicon materials, silicon oxycarbides (SiOC), and combinations thereof.

14. The method of claim 12, further comprising one or more top dielectric material layers deposited between the bulk dielectric insulating layer and the first resist material layer, wherein the one or more top dielectric material layers comprises a material selected from the group consisting of silicon oxynitrides (SiON), carbon containing silicon materials, silicon oxycarbides (SiOC), silicon carbides, silicon nitrides (SiN), carbon containing silicon nitride materials (SiCN), silicon oxide ($SiO_2$), tetra-ethyl-ortho-silicate (TEOS) based oxide, and combinations thereof.

15. The method of claim 12, further comprising a hard mask material layer deposited between the bulk dielectric insulating layer and the first resist material layer, wherein the hard mask material layer comprises a material selected from the group consisting of tantalum, titanium, tungsten, tantalum nitride, titanium nitride, tungsten nitride, amorphous silicon, and combinations thereof, deposited over the dielectric film stack.

16. The method of claim 12, further comprising annealing the surface of the substrate after the one or more trenches and one or more vias are formed.

17. The method of claim 12, further comprising depositing an additional organic fill material layer between the mask layer and the second resist material layer.

18. A method of forming a dual damascene structure on the surface of a substrate having a bottom barrier layer, a bulk dielectric insulating layer, and a first resist material layer deposited thereon, comprising:

performing trench lithography on the first resist material layer to form a trench pattern thereon prior to performing via lithography on a second resist material layer to form a via pattern thereon;

etching a portion of the bulk dielectric insulating layer to define one or more trenches therein according to the trench pattern on the first resist material layer;

filling the one or more trenches with an organic material, wherein the second resist material layer is applied over a mask layer deposited over the organic material;

etching the mask layer, the organic material, and the bulk dielectric insulating layer to define one or more vias therein according to the via pattern on the second resist material layer;

etching the bottom barrier layer to form the one or more vias therein according to the via pattern;

removing the organic material from the organic material filled trenches and the one or more vias; and forming the one or more trenches and one or more vias therein the dielectric film stack on the surface of the substrate.

19. The method of claim 18, wherein the bulk dielectric insulating layer comprises a low K dielectric material selected from the group consisting of organosilicate materials, porous oxide materials, silsesquioxane materials, polymer materials, benzocyclobutene, polytetrafluoroethylene, parylene, polyether, polyimide, polyamide materials, carbon-doped dielectrics materials, carbon-doped organo-silicate glass (OSG) materials, carbon-doped silicon dioxides, spin-on glass materials, un-doped silicon glass (USG) materials, fluorine-doped silicon glass (FSG) materials, carbon containing silicon materials, silicon oxycarbides (SiOC), and combinations thereof.

20. The method of claim 18, further comprising one or more top dielectric material layers deposited between the bulk dielectric insulating layer and the first resist material layer, wherein the one or more top dielectric material layers comprises a material selected from the group consisting of silicon oxynitrides (SiON), carbon containing silicon materials, silicon oxycarbides (SiOC), silicon carbides, silicon nitrides (SiN), carbon containing silicon nitride materials (SiCN), silicon oxide ($SiO_2$), tetra-ethyl-ortho-silicate (TEOS) based oxide, and combinations thereof.

21. The method of claim 18, further comprising a hard mask material layer deposited between the bulk dielectric insulating layer and the first resist material layer.

* * * * *

UNITED STATES PATENT AND TRADEMARK OFFICE
CERTIFICATE OF CORRECTION

| | |
|---|---|
| PATENT NO. | : 7,618,889 B2 |
| APPLICATION NO. | : 11/488529 |
| DATED | : November 17, 2009 |
| INVENTOR(S) | : Naik |

It is certified that error appears in the above-identified patent and that said Letters Patent is hereby corrected as shown below:

In the Detailed Description:

Column 5, Line 46, please delete "tetra-ethyl-ortho-silicate" and insert --tetra-ethyl-ortho-silicate-- therefor;

Column 5, Lines 63-64, please delete "tetra-ethyl-ortho-silicate" and insert --tetra-ethyl-ortho-silicate-- therefor;

Column 6, Line 19, please delete "tetra-ethyl-ortho-silicate" and insert --tetra-ethyl-ortho-silicate-- therefor;

In the Claims:

Column 16, Claim 5, Line 13, please delete "tetra-ethyl-ortho-silicate" and insert --tetra-ethyl-ortho-silicate-- therefor;

Column 17, Claim 14, Line 16, please delete "tetra-ethyl-ortho-silicate" and insert --tetra-ethyl-ortho-silicate-- therefor;

Column 18, Claim 20, Line 35, please delete "tetra-ethyl-ortho-silicate" and insert --tetra-ethyl-ortho-silicate-- therefor.

Signed and Sealed this

Fifth Day of January, 2010

David J. Kappos
*Director of the United States Patent and Trademark Office*